United States Patent [19]

Uenishi et al.

[11] Patent Number: 5,248,582

[45] Date of Patent: Sep. 28, 1993

[54] POSITIVE-TYPE PHOTORESIST COMPOSITION

[75] Inventors: Kazuya Uenishi; Shinji Sakaguchi; Tadayoshi Kokubo, all of Shizuoka, Japan

[73] Assignee: Fuji Photo Film Co., Ltd., Kanagawa, Japan

[21] Appl. No.: 987,562

[22] Filed: Dec. 8, 1992

Related U.S. Application Data

[63] Continuation of Ser. No. 772,126, Oct. 9, 1991, abandoned, which is a continuation of Ser. No. 403,975, Sep. 7, 1989, abandoned.

[30] Foreign Application Priority Data

Sep. 7, 1988 [JP] Japan .................................. 63-223740

[51] Int. Cl.$^5$ .................... G03F 7/023; G03F 7/32; C07C 245/00
[52] U.S. Cl. .................................. 430/192; 430/165; 430/190; 430/191; 430/193; 430/326; 534/557
[58] Field of Search ............... 430/191, 190, 192, 193, 430/165, 326; 534/556, 557

[56] References Cited

U.S. PATENT DOCUMENTS

| | | | |
|---|---|---|---|
| 3,046,118 | 7/1962 | Schmitt | 430/193 |
| 3,046,119 | 7/1962 | Sus | 430/193 |
| 3,106,465 | 10/1963 | Neugebauer et al. | 430/193 |
| 3,148,983 | 9/1964 | Endermann et al. | 430/193 |
| 3,180,733 | 4/1965 | Neugebauer et al. | 430/193 |
| 4,871,645 | 10/1989 | Uenishi et al. | 430/193 |

OTHER PUBLICATIONS

Patent Abstracts of Japan, vol. 11, No. 93 (P-559)(2540), Mar. 24, 1987 & JP-A-61 245154 (Dainippon Ink & Chem. Inc.) Oct. 31, 1986.
FR-A-2129497 (Mita Industrial Co., Ltd.).
FR-A-1304424 (Ciba S.A.).
Patent Abstracts of Japan, vol. 5, No. 115 (P-72)(787) Jul. 24, 1981 & JP-A-56 57035 (Fuji Takuhin Kogyo K.K.) May 19, 1981.

*Primary Examiner*—Charles L. Bowers, Jr.
*Assistant Examiner*—John S. Chu
*Attorney, Agent, or Firm*—Sughrue, Mion, Zinn, Macpeak & Seas

[57] ABSTRACT

A positive type photoresist composition which comprises an alkali soluble novolak resin and at least one light-sensitive material represented by the following general formulae (I) to (IV) to provide a resist pattern with high resolution, high reproduction fidelity, desirable sectional shape, wide latitude of development, high heat resistance and high storage stability:

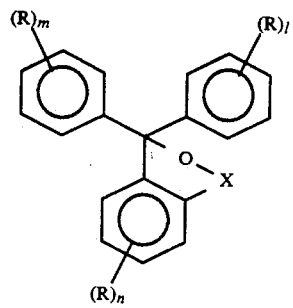

[I]

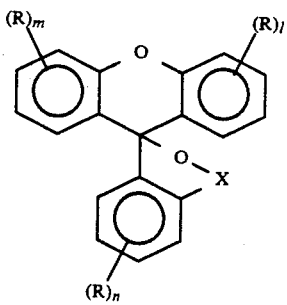

[II]

(Abstract continued on next page.)

-continued

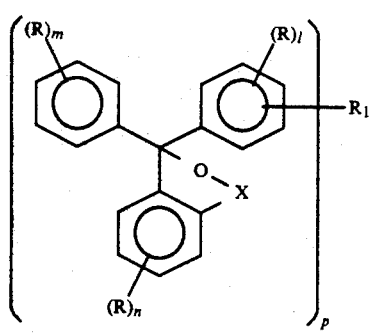

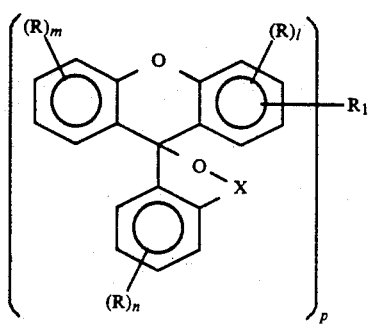

(wherein X represents —CO—, or —SO$_2$—; p represents an integer from 2 to 4; R's may be the same or different, each being —H, —OH, a substituted or unsubstituted alkyl group, a substituted or unsubstituted alkoxy group, a substituted or unsubstituted aryl group, a substituted or unsubstituted aralkyl group, a substituted or unsubstituted acyl group, a substituted or unsubstituted acyloxy group,

[III] 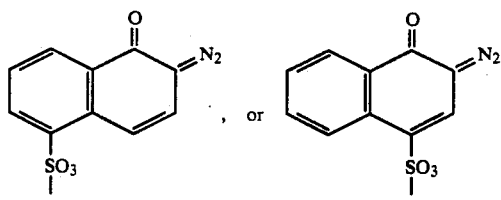

provided that R always contains at least one of

[IV] 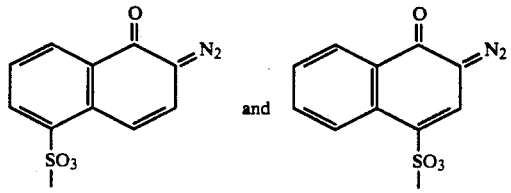

; R$_1$ represents

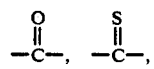

a substituted or unsubstituted di- to tetra-valent alkyl group, or a substituted or unsubstituted di- to tetra-valent aromatic group; and l, m and n Represent 0 or an integer of from 1 to 3, provided that at least one of them is not zero).

7 Claims, No Drawings

POSITIVE-TYPE PHOTORESIST COMPOSITION

This is a continuation of application Ser. No. 07/772,126 filed Oct. 9, 1991, now abandoned which is a continuation of application Ser. No. 07/403,975 filed on Sep. 7, 1989, now abandoned.

FIELD OF THE INVENTION

This invention relates to a radiation-responsive positive-type photoresist composition and, more particularly, to a photoresist composition for fine processing which has high resolution and high sensitivity, and can form a pattern with a desirable cross-sectional shape. The positive-type photoresist according to this invention is coated on a semiconductor wafer or a substrate made of glass, ceramic, on metal in a thickness of 0.5 to 3 microns using a spin coating method or a roller coating method. Thereafter, the coat is heated and dried, and therein a circuit pattern or the like is printed out by ultraviolet irradiation or the like through an exposure mask, which is then developed to form a positive image. Further, etching is carried out using this positive image as a mask, thus performing a pattern-form processing on the substrate. Representatives of the fields to which photoresists can be applied are processing in semiconductor production for IC and the like, manufacturing of circuit bases for liquid crystal, thermal head and so on, and other photofabrication processes.

BACKGROUND OF THE INVENTION

In general, positive-type photoresist compositions which have been used are those containing an alkali soluble resin and a naphthoquinonediazide compound functioning as a light-sensitive material. For instance, they are described, e.g., in U.S. Pat. Nos. 3,666,473, 4,115,128 and 4,173,470 as "novolak type phenol resin/substituted compound of naphthoquinonediazide". As the most typical examples of such compositions, L.F. Thompson, *Introduction to Microlithography*, No. 219, pp. 112-121, ACS Publishers describes examples of "cresolformaldehyde type novolak resin/trihydroxybenzophenone-1,1-naphthoquinonediazidosulfonic acid ester".

Novolak resins are soluble in an alkaline aqueous solution without swelling therein, and confer high resistance to etching, especially plasma etching, upon produced images when the images are used the etching mask. This is because they are particularly effective as binders. On the other hand, naphthoquinonediazide compounds used as a light-sensitive material are peculiar in the respect that though they themselves act as dissolution inhibitor which lowers the solubilities of novolak resins in an alkali, they produce an alkali-soluble substance when irradiated with light to undergo decomposition, resulting in rather heightening the solubilities of novolak resins in alkali. Because of a great change in their nature upon optical exposure, naphthoquinone diazide compounds are particularly useful as a light-sensitive material.

From those standpoints, a number of positively working photoresists comprising a novolak resin and a naphthoquinonediazide type light-sensitive material has been developed, and practically used. Although they have accomplished satisfactory results in line width processing of the order of 1.5 to 2 microns, the integrated circuits at present come to have an increasingly raised degree of integration, and require the processing of hyperfine patterns with a line width of below 1 micron in the production of semiconductor substrates for VLSI (very large-scale integrated circuits) and the like. For such use, it is required of photoresists to be endowed with a particularly high resolution, a high accuracy in pattern-shape reproduction or a great ability to duplicate accurately the shape of a exposure mask, and a high sensitivity from the standpoint of high productivity. That is, it is the real situation that conventional positive-type photoresists as described above cannot answer to the needs.

SUMMARY OF THE INVENTION

Therefore, an object of this invention is to provide a positive-type photoresist composition which can exhibit the following abilities, especially in the production of semi-conductor devices:

(1) to have a high resolution, (2) to reproduce accurately a mask pattern in dimensions covering over a wide range of line widths of the photo-mask, (3) to form a resist pattern whose sectional shape has a high aspect ratio when the pattern has a line width of below 1 micron, (4) to form a pattern having such a shape that the lateral wall of the pattern section stands almost perpendicularly, (5) to have a wide latitude of development, and (6) to produce a resist image excellent in heat resistance.

As a result of examining various compositions taking into account the above-described characteristics, it has now been found that the object of this invention can be attained with a positive-type photoresist composition which contains at least one light-sensitive material represented by the following general formulae (I) to (IV) and an alkali-soluble novolak resin:

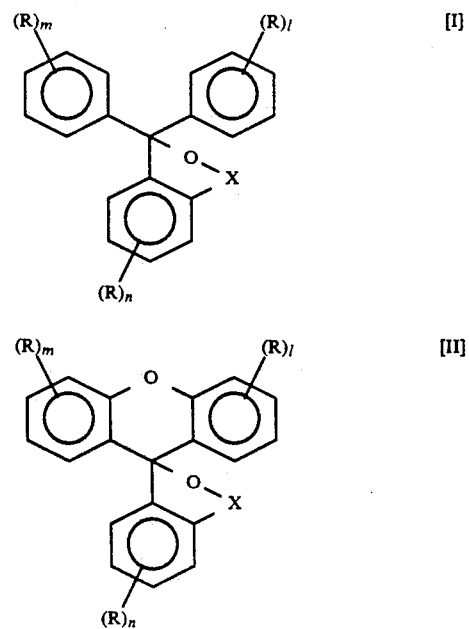

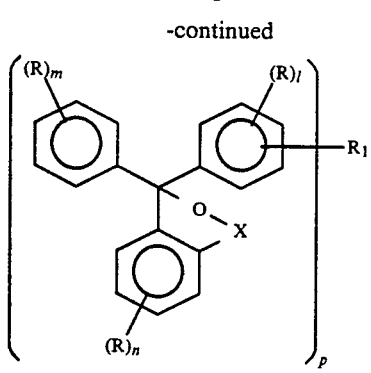

[III]

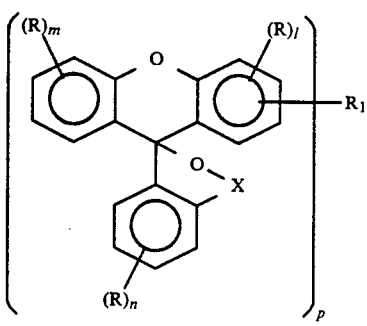

[IV]

(wherein X represents —CO—, or —SO$_2$—; p represents an integer from 2 to 4; R's may be the same or different, each being —H, —OH, a substituted or unsubstituted alkyl group, a substituted or unsubstituted alkoxy group, a substituted or unsubstituted aryl group, a substituted or unsubstituted aralkyl group, a substituted or unsubstituted acyl group, a substituted or unsubstituted acyloxy group,

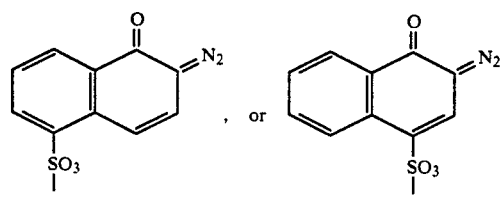

provided that R always contains at least one of

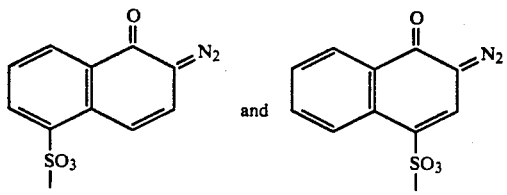

; R$_1$ represents

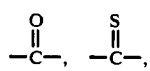

a substituted or unsubstituted di- to tetra-valent alkyl group, or a substituted or unsubstituted di- to tetravalent aromatic group; and l, m and n represent 0 or an integer of from 1 to 3, provided that at least one of them is not zero).

DETAILED DESCRIPTION OF THE INVENTION

A substituent R in the foregoing formulae includes groups set forth above. As for the groups other than the naphthoquinonediazidosulfonyl groups, there can be given as preferred examples unsubstituted alkyl or alkoxy groups containing 1 to 8 carbon atoms, unsubstituted aryl or aralkyl groups containing 6 to 15 carbon atoms, alkyl or alkoxy groups which contain 1 to 8 carbon atoms and are substituted by an alkoxy group, an aryloxy group, an aryl group, hydroxyl group, carboxyl group, a sulfo group, an amino group, nitro group, silyl group, a silyl ether group, cyano group, aldehydo group, mercapto group, a halogen atom or so on, aryl or aralkyl groups which contain 6 to 15 carbon atoms and are substituted by an alkoxy group, an aryloxy group, an aryl group, hydroxyl group, carboxy group, a sulfo group, an amino group, nitro group, silyl group, a silyl ether group, cyano group, aldehydo group, mercapto group, a halogen atom or so on, and aliphatic or aromatic acyl or acyloxy groups containing 2 to 15 carbon atoms.

A substituent R$_1$ represents

a di- to substituted or unsubstituted aliphatic linkage group containing 1 to 4 carbon atoms, or a di- to tetravalent substituted or unsubstituted aromatic linkage group containing 6 to 15 carbon atoms.

Among the compounds represented by formulae (I) to (IV), preferred are those, wherein X represents

group, and more preferably the substituent at an unesterfied part of the compound further represents —H, —OH, straight or branched alkyl, alkoxy, acyl, or acyloxy group having 1 to 4 carbon atoms.

The light-sensitive materials represented by the general formulae (I) to (IV) are obtained by allowing polyhydroxy compounds represented by the following general formulae (I') to (IV') to react with 1,2-napthoquinone-diazido-5 (and/or -4) -sulfonyl chloride:

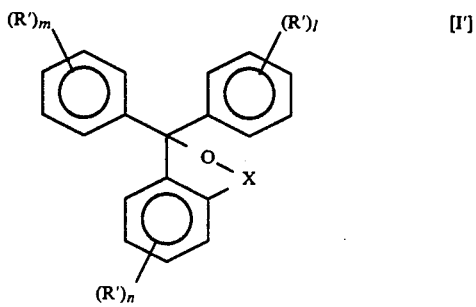

[I']

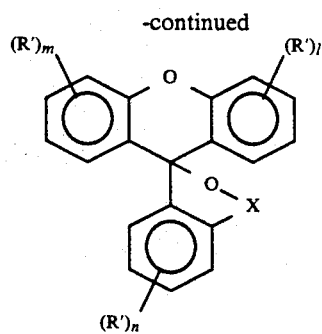

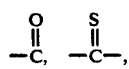

(wherein X represents —CO— or —SO₂—; p represents an integer from 2 to 4; (R')'s may be the same or different, each being —H, —OH, a substituted or unsubstituted alkyl group, a substituted or unsubstituted alkoxy group, a substituted or unsubstituted aryl group, a substituted or unsubstituted aralkyl group, a substituted or unsubstituted acyl group, or a substituted or unsubstituted acyloxy group, provided that R' always contains at least one —OH; R'₁ represents $$\overset{O}{\underset{\|}{-C-}},\quad \overset{S}{\underset{\|}{-C-}},$$

a di- to tetra-valent substituted or unsubstituted aliphatic group, or a di- to tetra-valent substituted or unsubstituted aromatic group; and l, m and n are each an integer of 0 to 3, provided that at least one of them is not zero).

A substituent R' includes the above-described groups. As for the groups other than —OH group, there can be given as preferred examples unsubstituted alkyl or alkoxy groups containing 1 to 8 carbon atoms, unsubstituted aryl or aralkyl groups containing 6 to 15 carbon atoms, alkyl or alkoxy groups which contain 1 to 8 carbon atoms and are substituted by an alkoxy group, an aryloxy group, an aryl group, hydroxyl group, carboxyl group, a sulfo group, an amino group, nitro group, silyl group, a silyl ether group, cyano group, aldehydo group, mercapto group, a halogen atom or so on, aryl or aralkyl groups which contain 6 to 15 carbon atoms and are substituted by an alkoxy group, an aryloxy group, an aryl group, hydroxyl group, carboxyl group, a sulfo group, an amino group, nitro group, silyl group, a silyl ether group, cyano group, aldehydo group, mercapto group, a halogen atom or so on, and aliphatic or aromatic acyl or acyloxy group containing 2 to 15 carbon atoms.

A substituent R'₁ represents

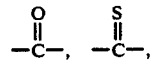

a di- to tetra-valent substituted or unsubstituted aliphatic linkage group containing 1 to 4 carbon atoms, or a di- to tetra-valent substituted or unsubstituted aromatic linkage group containing 6 to 15 carbon atoms.

The compounds represented by the general formulae (I') to (IV') can be obtained by condensing substituted or unsubstituted phenols and substituted or unsubstituted phthalic or sulfophthalic acid anhydride in accordance with the procedure of H.L. Rohatgi, et al. (*Indian J. Appl. Chem.*, vol. 21, No. 3, p. 117 (1958), or by condensing substituted or unsubstituted o-benzoylbenzoic acids and substituted or unsubstituted phenols in accordance with the procedure of P.S. Makhloga, et al. (*J. Inst. Chem.*, vol. 55, No. 5, p. 209 (1983)).

The esterification reaction of the polyhydroxy compounds represented by the general formulae (I') to (IV') with 1,2-naphthoquinonediazido-5-sulfonyl chloride or 1,2-naphthoquinonediazido-4-sulfonyl chloride can be effected in a conventional manner. Specifically, the polyhydroxy compound of the formula (I') to (IV'), 1,2-naphthoquinonediazido-5-sulfonyl chloride or 1,2-naphtho-quinonediazido-4-sulfonyl chloride, and a solvent, such as dioxane, acetone, methyl ethyl ketone, N-methylpyrrolidone or the like, are put in prescribed amounts, respectively, in a flask, and therein the condensation reaction is conducted by the dropwise addition of a basic catalyst, such as a solution of sodium hydroxide, sodium carbonate, sodium hydrogen carbonate, triethylamine or so on. The obtained product is washed with water, purified, and dried. According to the above-described process, the light-sensitive material represented by the general formulae (I) to (IV) can be prepared.

In the above-described esterification reaction, a mixture of compounds differing from one another in number and position of the esterified groups is obtained. Accordingly, the term esterification rate as used in this invention is defined as a mean value among those of mixed compounds.

The esterification rate according to the present invention is preferably 40 to 90%, most preferably 50 to 90%.

The thus defined esterification rate can be controlled by properly choosing a mixing ratio between the starting materials, the compound of the formulae (I') to (IV') and 1,2-naphthoquinonediazido-5 (and/or -4)-sulfonyl-chloride. That is, as all the added molecules of 1,2-naphthoquinonediazido-5 (and/or 4-)sulfonyl chloride undergo esterification reaction from the substantial point of view, the adjustment of a mole ratio between the starting materials will suffice to produce a mixture of a desired esterification rate.

Alkali-soluble novolak resins to be used in this invention are obtained by the addition condensation of 1 mole of phenols and 0.6 to 1.0 mole of aldehydes in the presence of an acid catalyst. As the phenols, phenol, o-cresol, m-cresol, p-cresol, xylenol and the like can be used alone or in combination of two or more thereof. Suitable examples of aldehydes which can be used herein include formaldehyde, paraformaldehyde, acetaldehyde, halogenated acetaldehyde (e.g. chloroacetaldehyde, bromoacetaldehyde), furfural and so on, and those of acid catalysts which can be used include hydrochloric acid, sulfuric acid, formic acid, oxalic acid, acetic acid and so on. The thus obtained novolak resins having a molecular weight of from 1,000 to 50,000 manifest solubilities in alkalis.

As for the ratio between the light-sensitive material and the alkali-soluble novolak resin in the composition of this invention, the light-sensitive material is used in a quantity of from 5 to 100 parts by weight, preferably from 10 to 50 parts by weight, per 100 parts by weight of the novolak resin. When the light-sensitive material is used in a quantity less than 5 parts by weight, a residual film rate is considerably lowered, whereas when the quantity is increased beyond 100 parts by weight the sensitivity of the resulting composition and the solubilities thereof in solvents are lowered.

The foregoing light-sensitive materials, though must be mainly used in this invention, can be used together with conventional light-sensitive materials, e.g., ester compounds prepared from 2,3,4-trihydroxybenzophenone, 2,4,4'-trihydroxybenzophenone, 2,4,6-trihydroxybenzophenone, etc., and 1,2-naphthoquinonediazido-5 (and/or -4)-sulfonyl chloride, if desired. Therein, such ester compounds can be used in an amount of below 100 parts by weight, preferably below 30 parts by weight, per 100 parts by weight of the foregoing light-sensitive materials of the formulae (I) to (IV).

The compositions of this invention can additionally contain polyhydroxy compounds for the purpose of promoting the dissolution into a developer. Examples of polyhydroxy compounds which can be preferably used for that purpose include phenols, resorcin, fluoroglucin, 2,3,4-trihydroxybenzophenone, 2,3,4,4'-tetrahydroxybenzophenone, 2,3,4,3',4',5'-hexahyroxybenzophenone, acetonepyrogallol condensation resin, and so on.

Examples of solvents suitable for dissolution of both are light-sensitive materials of this invention and alkali-soluble novolak resins include ketones such as methyl ethyl ketone, cyclohexanone, etc., alcohol ethers such as ethylene glycol monomethyl ether, ethylene glycol monoethyl ether, etc., ethers such as dioxane, ethylene glycol dimethyl ether, etc., cellosolve esters such as methylcellosolve acetate, ethylcellosolve acetate, etc., fatty acid esters such as methyl lactate, ethyl lactate, butyl acetate, etc., halogenated hydrocarbons such as 1,1,2-trichlorethylene, etc., and highly polar solvents such as dimethylacetamide, N-methylpyrrolidone, dimethylformamide, dimethyl sulfoxide, etc. These solvents can be used alone or as a mixture of two or more thereof.

The present composition for positive-type photoresist can be compounded with dyes, plasticizers, auxiliary adhesives, surfactants and so on, if needed. As examples of the dyes, there can be given Methyl Violet, Crystal Violet, Malachite Green and so on. As examples of the plasticizers, there can be given stearic acid, acetal resins, phenoxy resins, alkid resins and so on. Further, examples of auxiliary adhesives include hexamethyldisilazane, chloromethylsilane and the like, and those of surfactants include nonylphenoxypoly(ethyleneoxy)ethanol, octylphenoxypoly(ethyleneoxy)ethanol and so on.

The above-described positive-type photoresist composition is coated on such a substrate as to be used for the production of precision integrated circuit elements, in which, for example, the substrate is silicon/silicon dioxide, according to a proper coating method, e.g., a spinner, a coater or so on, exposed to light through a prescribed mask, and then developed, resulting in the formation of excellent resist.

As for the developer to be used for the positive-type photoresist composition of this invention, aqueous solutions of inorganic alkalis such as sodium hydroxide, potassium hydroxide, sodium carbonate, sodium silicate, sodium metasilicate, aqueous ammonia and so on, or organic alkalis such as primary amines, e.g., ethylamine, n-propylamine, etc., secondary amines, e.g., diethylamine, di n-butylamine, etc., tertiary amines, e.g., triethylamine, methyldiethylamine, etc., alcoholamines such as dimethylethanolamines, triethanolamine, etc., quaternary ammonium salts, e.g., tetramethylammonium hydroxide, tetraethylammonium hydroxide, etc., cyclic amines, e.g., pyrrole, piperidine, etc., and so on can be used. Further, proper amounts of alcohols and/or surfactants can be added to the above-described aqueous solutions of alkalis.

The positive-type photoresist obtained in accordance with this invention is excellent in high resolution, reproduction fidelity, sectional shape of resist image, latitude of development, heat resistance, and storage stability of resist.

This invention will now be illustrated in more detail by reference to the following examples. However, the invention should not be construed as being limited to these examples. In the following examples, all percentages (%) are by weight unless otherwise indicated.

EXAMPLES 1 TO 7 AND COMPARATIVE EXAMPLE 1

The syntheses of the light-sensitive materials of this invention are described in the following synthesis examples (1) to (7), and that of a light-sensitive material for comparison is described in the following synthesis example (8).

SYNTHESIS EXAMPLE (1)

Synthesis of Light—Sensitive Material (a)

Ten gram of the following compound (a'),

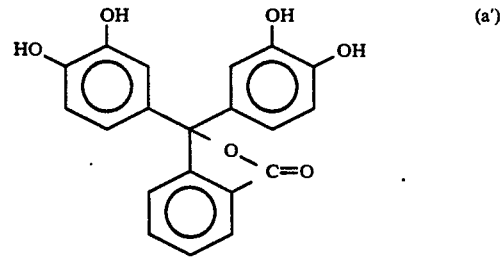

19.2 g of 1,2 naphthoquinonediazido-5-sulfonyl chloride and 200 ml of acetone were put in a three necked flask, and homogeneously dissolved. Thereto, a mixture of 7.6 g of triethylamine with 30 ml of acetone was slowly added dropwise, running the reaction for 3 hours at 25°

C. The thus obtained reaction mixture was poured into 1,000 ml of a 1% aqueous solution of hydrochloric acid to produce a precipitate. The precipitate was filtered off, washed with water, and dried at 40° C. to yield 24.8 g of 1,2-naphthoquinonediazido-5-sulfonic acid ester of the compound (a'), which showed an esterification rate of 62.5%.

SYNTHESIS EXAMPLE (2)

Synthesis of Light—Sensitive Material (b)

Ten gram of the following compound (b'),

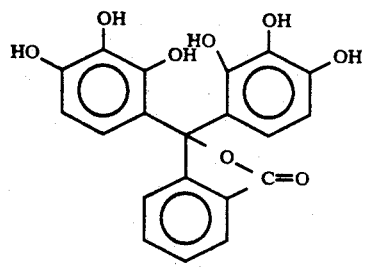
(b')

28.1 g of 1,2-naphthoquinonediazido-5-sulfonyl chlrodie and 300 ml of acetone were put in a three necked flask, and homogeneously dissolved. Thereto, a mixture of 11.1 g of triethylamine with 40 ml of acetone was slowly added dropwise, running the reaction for 3 hours at 25° C. The thus obtained reaction mixture was poured into 1,500 ml of a 1% aqueous solution of hydrochloric acid to produce a precipitate. The precipitate was filtered off, washed with water, and dried at 40° C. to yield 31.6 g of 1,3-naphthoquinonediazido-5-sulfonic acid ester of the compound (b'), which showed an esterification rate of 66.7%.

SYNTHESIS EXAMPLE (3)

Synthesis of Light—Sensitive Material (c)

Ten gram of the following compound (c'),

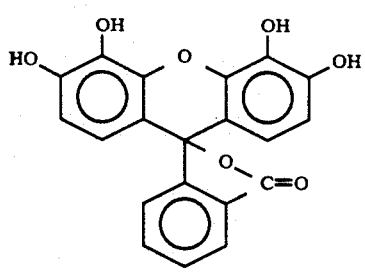
(c')

14.8 g of 1,2-naphthoquinonediazido-5-sulfonyl chloride and 200 ml of acetone were put in a three necked flask, and homogeneously dissolved. Thereto, a mixture of 5.9 g of triethylamine with 20 ml of acetone was slowly added dropwise, running the reaction for 3 hours at 25° C. The thus obtained reaction mixture was poured into 1,000 ml of a 1% aqueous solution of hydrochloric acid to produce a precipitate. The precipitate was filtered off, washed with water, and dried at 40° C. to yield 20.3 g of 1,2-naphthoquinonediazido-5-sulfonic acid ester of the compound (c'), which showed an esterification rate of 50.0%.

SYNTHESIS EXAMPLE (4)

Synthesis of Light—Sensitive Material (d)

Ten gram of the following compound (d'),

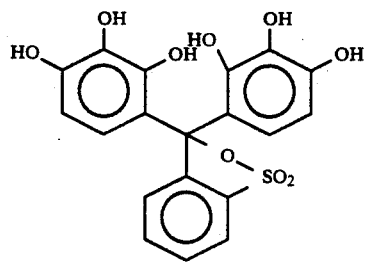
(d')

28.9 g of 1,2-naphthoquinonediazido-5-sulfonyl chloride and 350 ml of acetone were put in a three necked flask, and homogeneously dissolved. Thereto, a mixture of 11.4 g of triethylamine with 40 ml of acetone was slowly added dropwise, running the reaction for 3 hours at 25° C. The thus obtained reaction mixture was poured into 1,750 ml of a 1% aqueous solution of hydrochloric acid to produce a precipitate. The precipitate was filtered off, washed with water, and dried at 40° C. to yield 33.5 g of 1,2-naphthoquinonediazido-5-sulfonic acid ester of the compound (d'), which showed an esterification rate of 75.0%.

SYNTHESIS EXAMPLE (5)

Synthesis of Light—Sensitive Material (e)

Ten gram of the following compound (e'),

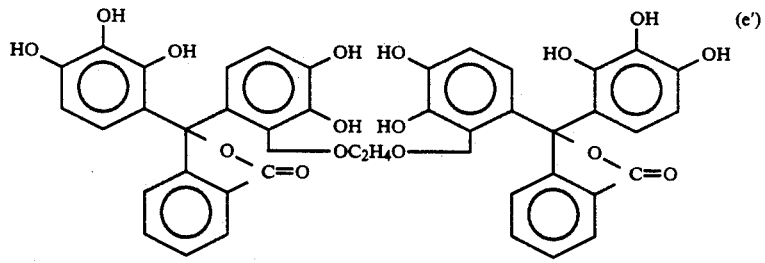
(e')

20.4 g of 1,2-naphthoquinonediazido-5-sulfonyl chloride and 400 ml of acetone were put in a three necked flask, and homogeneously dissolved. Thereto, a mixture of 8.1 g of triethylamine with 35 ml of acetone was slowly added dropwise, running the reaction for 3 hours at 25° C. The thus obtained reaction mixture was poured into 2,000 ml of a 1% aqueous solution of hydrochloric acid to produce a precipitate. The precipitate was filtered off, washed with water, and dried at 40° C. to yield 25.8 g of 1,2-naphthoquinonediazido-5-sulfonic acid ester of the compound (e'), which showed an esterification rate of 60.0%.

SYNTHESIS EXAMPLE (6)

Synthesis of Light—Sensitive Material (f):

Ten gram of the following compound (f'),

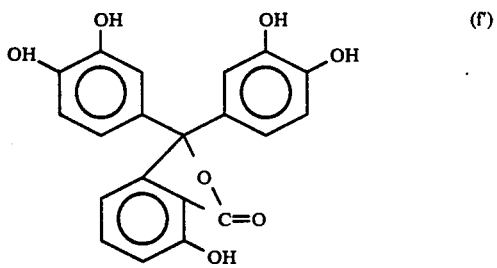

22.0 g of 1,2-naphthoquinonediazido-5-sulfonyl chloride and 300 ml of acetone were put in a three necked flask, and homogeneously dissolved. Thereto, a mixture of 8.7 g of triethylamine with 30 ml of acetone was slowly added dropwise, running the reaction for 3 hours at 25° C. The thus obtained reaction mixture was poured into 1,500 ml of a 1% aqueous solution of hydrochloric acid to produce a precipitate. The precipitate was filtered off, washed with water, and dried at 40° C. to yield 27.8 g of 1,2-naphthoquinonediazido-5-sulfonic acid ester of the compound (f'), which showed an esterification rate of 0.0%.

SYNTHESIS EXAMPLE (7)

Synthesis of Light—Sensitive Material (g)

Ten gram of the following compound (g'),

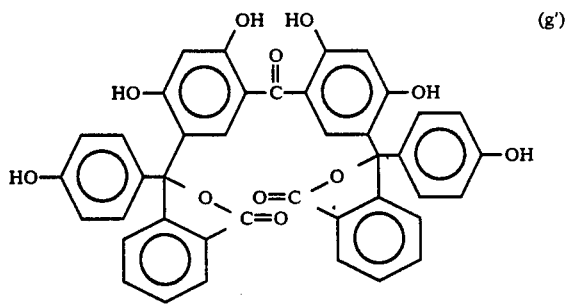

15.5 g of 1,2-napthoquinonediazido-5-sulfonyl chloride and 350 ml of acetone were put in a three necked flask, and homogeneously dissolved. Thereto, a mixture of 6.1 g of triethylamine with 20 ml of acetone was slowly added dropwise, running the reaction for 3 hours at 25° C. The thus obtained reaction mixture was poured into 1,750 ml of a 1% aqueous solution of hydrochloric acid to produce a precipitate. The precipitate was filtered off, washed with water, and dried at 40° C. to yield 21.2 g of 1,2-naphthoquinonediazido-5-sulfonic acid ester of the compound (g'), which showed an esterification rate of 66.7%.

SYNTHESIS EXAMPLE (8)

Synthesis of Light—Sensitive Material (h) for Comparison

In a three necked flask, 10.0 g of 2,3,4,4'-tetrahydroxybenzophenone, 30 g of 1,2-naphthoquinonediazido-5-sulfonyl chloride and 300 ml of acetone were put, and homogeneously dissolved. Thereto, a mixture of 11.3 g of triethylamine with 30 ml of acetone was slowly added dropwise, running the reaction for 3 hours at 25° C. The thus obtained reaction mixture was poured into 1,500 ml of a 1% aqueous solution of hydrochloric acid to produce a precipitate. The precipitate was filtered off, washed with water, and dried at 40° C. to yield 27.5 g of 1,2-naphthoquinonediazido-5-sulfonic acid ester of 2,3,4,4'tetrahydroxybenzophenone, which showed an esterification rate of 75.0%.

SYNTHESIS EXAMPLE (9)

Synthesis of Novolak Resin

In a three necked flask, 40 g of m-cresol, 60 g of p-cresol, 49.5 g of a 37% aqueous solution of formaldehyde and 0.05 g of oxalic acid were placed, and heated up to 100° C. with stirring to run the reaction over a 7-hour period. Thereafter, the reaction system was cooled to room temperature, and the pressure therein was reduced to 30 mmHg. Then, the temperature of the reaction system was gradually raided up to 150° C. to remove water and unreacted monomers. The thus obtained novolak resin had a weight average molecular weight of 7,000 (on a polystyrene basis).

Preparation and Evaluation of Positive-Type Photoresist Composition

Each 1.10 g of the light-sensitive material obtained in Synthesis Examples (1) to (8) and 5 g of cresol novolak resin (molecular weight: 7,000) obtained in Synthesis Example (9) were dissolved in 18 g of ethyl lactate, and filtered through a 0.1 micron microfilter to prepare a photoresist composition. This composition was coated on a silicon wafer using a spinner, and dried in an atmosphere of nitrogen for 30 minutes at 110° C. using a convection oven. Thus, a resist film having a thickness of 1.2 microns was prepared. This film was exposed with a reduced projection type exposure apparatus (NSR 1505, produced by Nikon), developed for 1 minute with a 2.38% aqueous solution of tetramethylammonium hydroxide, washed with water for 30 seconds, and dried. The thus obtained resist pattern on the silicon wafer was observed under a scanning electron microscope to evaluate the resist qualities. The results obtained are shown in Table-1.

The sensitivity was defined as a reciprocal of exposure required for reproduction of a 1.0 micron mask pattern, and shown as relative value, with Comparative Example 1 being taken as 1.0.

The residual film rate was expressed in terms of the ratio between the film areas in the unexposed part after and before the development, and shown in percentage.

The resolution was represented by the limiting resolution under the exposure to effect the reproduction of a 1.0 micron mask pattern.

The heat resistance was represented by the temperatures at which though the resist pattern formed on the silicon wafer is baked for 30 minutes in a convection oven, it does not suffer any deformation.

The shape of the resist was represented by an angle ($\theta$) which the plane of the resist wall made to the plane of silicon wafer in the longitudinal section of 1.0 micron resist pattern.

TABLE-1

| | Light-Sensitive Material | Relative Sensitivity | Residual Film Rate (%) | Resolution (μm) | Heat Resistance (°C.) | Shape of Resist (θ) |
|---|---|---|---|---|---|---|
| Example 1 | (a) | 1.2 | 100 | 0.7 | 135 | 89 |
| Example 2 | (b) | 1.3 | 100 | 0.7 | 140 | 88 |
| Example 3 | (c) | 1.2 | 99 | 0.75 | 130 | 89 |
| Example 4 | (d) | 1.1 | 98 | 0.65 | 140 | 85 |
| Example 5 | (e) | 1.1 | 100 | 0.7 | 145 | 87 |
| Example 6 | (f) | 1.2 | 100 | 0.7 | 140 | 89 |
| Example 7 | (g) | 1.2 | 99 | 0.7 | 140 | 87 |
| Comparative Example 1 | (h) | 1.0 | 98 | 0.85 | 130 | 85 |

As can be seen from the data in Table-1, the resists using the light-sensitive materials of this invention, from (a) to (g), were excellent, particularly in resolution and resist shape. Further, the light-sensitive materials of this invention had high solubilities in ethyl cellosolve acetate, so the solutions of the resist compositions using these light-sensitive materials didn't separate out any precipitates even after they were allowed to stand for 30 days at 40° C. On the other hand, the standing under the same condition caused separation of precipitates in the solution of the resist composition using the light-sensitive material (h) for comparison.

EXAMPLE 8

In 13.68 g of ethyl lactate were dissolved 1.04 g of the light-sensitive material (c) synthesized in Example 3 and 5.44 g of the novolak resin synthesized in Synthesis Example 9. The resulting solution was filtered through a 0.2 micron microfilter to prepare a photoresist composition.

This composition was coated on a silicon wafer covered with 2500 Å-thick oxidized film by means of a spinner, and dried in an atmosphere of nitrogen for 90 seconds at 80° C. using a vacuum adsorption type hot plate. Thus, a resist film 1.2 microns thick was prepared. This film was exposed to light through a test chart mask using a reduced projection type exposure apparatus produced by Nikon, baked for 4 min. at 110° C. with a vacuum adsorption type hot plate, developed for 1 minute with a 2.38 wt% aqueous solution of tetramethylammonium hydroxide, and rinsed with ion exchange water, resulting in the formation of a resist pattern. The thus obtained resist pattern was evaluated by the procedures employed in the foregoing examples. However, the heat resistance was evaluated by the temperature at which the resist pattern formed on the silicon wafer began to be deformed by the 4 minutes' baking at a prescribed temperature by means of the vacuum adsorption type hot plate.

Thereupon, the resist had a relative sensitivity of 1.22, a residual film rate of 99.5%, heat resistance of 130° C. and a resolution of 0.65 micron.

EXAMPLES TO 11

In analogy with Example 8, resist compositions were prepared by using the light-sensitive materials (a), (b), (c) synthesized in Synthesis Examples 1, 2 and 3, respectively, the cresol type novolak resin prepared from a mixture of 45 wt% of m-cresol with 55 wt% of p-cresol and formaldehyde, and the solvents in their respective amounts set forth in Table-2, and evaluated. The results obtained are shown in Table-3.

As can be seen from the data in Table-3, the photoresists of this invention were all excellent in sensitivity, resolution, residual film rate and heat resistance. In addition, any precipitate was not observed in the photoresist solutions of this inventing even after 30 days' storage at 40° C.

Table-2

| | Light Sensitive Material | Novolak Resin | Solvent | |
|---|---|---|---|---|
| Example 9 | (a) 2.40 g | 10.93 g | 2-ethoxyethyl acetate | 35.1 g |
| Example 10 | (b) 1.88 g | 9.85 g | 2-ethoxyethyl acetate/ethyl lactate = 7/3 | 31.7 g |
| Example 11 | (c) 4.2 g | 14.9 g | diethylene glycol dimethyl ether | 44.6 g |

Table-3

| | Relative Sensitivity | Resolution | Residual Film Rate | Heat Resistance |
|---|---|---|---|---|
| Example 9 | 1.1 | 0.7 | 99.6% | 130° C. |
| Example 10 | 1.1 | 0.7 | 99.8% | 140° C. |
| Example 11 | 1.3 | 0.75 | 99.2% | 135° C. |

What is claimed is:

1. A positive-type photoresist composition comprising at least one light-sensitive material represented by the following formulae (I) to (IV) in admixture in an alkali soluble novolak resin:

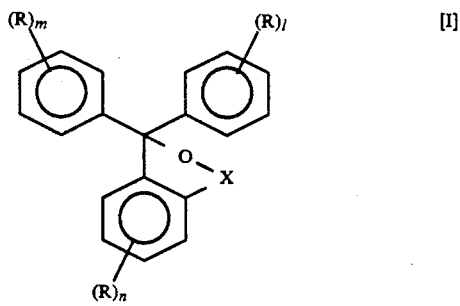

[I]

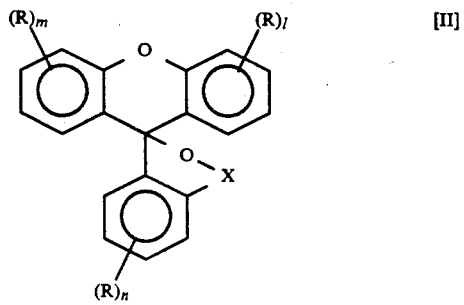

[II]

-continued

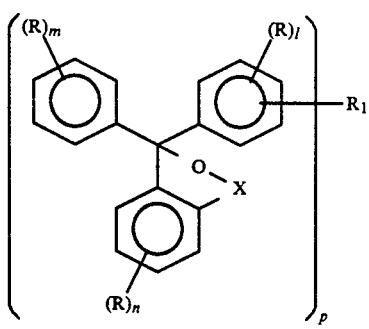

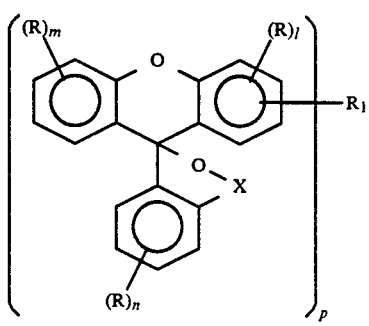

wherein X represents —CO—, or —SO₂—; p represents an integer from 2 to 4; R's may be the same or different, each being —H, —OH, a substituted or unsubstituted alkyl group, a substituted or unsubstituted alkoxy group, a substituted or unsubstituted aryl group, a substituted or unsubstituted aralkyl group, a substituted or unsubstituted acyl group, a substituted or unsubstituted acyloxy group,

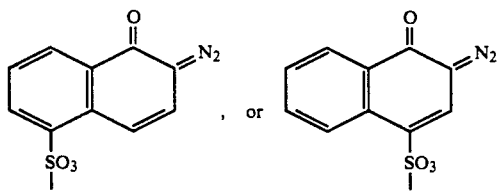

provided that R always contains at least one of

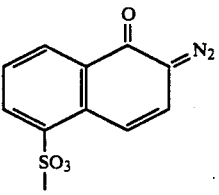 and 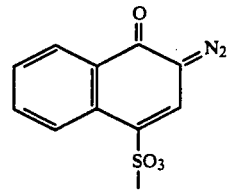

R₁ represents

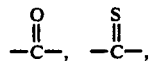

a substituted or unsubstituted di- to tetra-valent alkyl group, or a substituted or unsubstituted di- to tetravalent aromatic group; and l, m and n represent 0 or an integer of from 1 to 3, provided that at least one of them is not zero, said at least one light-sensitive material represented by formulae (I) to (IV) being present in an amount sufficient to change the solubility of the positive-type photoresist composition in alkali upon exposure to light.

2. A positive type photoresist composition according to claim 1, wherein X in formulae (I) to (IV) is

group.

3. A positive type photoresist composition according to claim 2, wherein a substituent at an unesterfied part of the compound of formulae (I) to (IV) represents —H, —OH, a straight or branched alkyl, alkoxy, acyl, and acyloxy group having 1 to 4 carbon atom.

4. A positive type photoresist composition according to claim 1, wherein an esterification rate of the compound of formulae (I) to (IV) is 40 to 95%.

5. A positive type photoresist composition according to claim 4, wherein the esterification rate is 50 to 90%.

6. A positive-type photoresist composition according to claim 1, wherein the light-sensitive material represented by formula (I) to (IV) is present in an amount of from 5 to 100 parts by weight based on 100 parts by weight of the novolak resin.

7. A positive-type photoresist composition according to claim 1, wherein the light-sensitive material represented by formula (I) to (IV) is present in an amount of from 10 to 50 parts by weight based on 100 parts by weight of the novolak resin.

* * * * *